US012586654B2

(12) United States Patent
Yu et al.

(10) Patent No.: US 12,586,654 B2
(45) Date of Patent: Mar. 24, 2026

(54) SYSTEM AND METHOD FOR PERIODIC MARCH TEST IN VOLATILE MEMORIES

(71) Applicant: Black Sesame Technologies Inc., San Jose, CA (US)

(72) Inventors: Qideng Yu, Sunnyvale, CA (US); Gengyuan Zhang, Santa Clara, CA (US); Wei Chen, Milpitas, CA (US); Ying Zhou, Santa Clara, CA (US)

(73) Assignee: Black Sesame Technologies Inc., San Jose, CA (US)

( * ) Notice: Subject to any disclaimer, the term of this patent is extended or adjusted under 35 U.S.C. 154(b) by 102 days.

(21) Appl. No.: 18/635,845

(22) Filed: Apr. 15, 2024

(65) Prior Publication Data

US 2025/0322896 A1 Oct. 16, 2025

(51) Int. Cl.
*G11C 29/10* (2006.01)
*G11C 29/44* (2006.01)

(52) U.S. Cl.
CPC .............. *G11C 29/10* (2013.01); *G11C 29/44* (2013.01)

(58) Field of Classification Search
CPC ................................. G11C 29/10; G11C 29/44
See application file for complete search history.

(56) References Cited

U.S. PATENT DOCUMENTS

| | | | | |
|---|---|---|---|---|
| 6,658,611 | B1 * | 12/2003 | Jun ................... | G11C 29/50012 |
| | | | | 365/201 |
| 7,260,759 | B1 * | 8/2007 | Zarrineh ............ | G01R 31/3187 |
| | | | | 365/201 |
| 10,108,376 | B1 * | 10/2018 | Zeng ................... | G06F 11/1048 |
| 2004/0230395 | A1 * | 11/2004 | Basto ............... | G11C 29/56004 |
| | | | | 702/117 |
| 2006/0028891 | A1 * | 2/2006 | Selva ..................... | G11C 29/44 |
| | | | | 365/222 |
| 2021/0197866 | A1 * | 7/2021 | Ikenori ................ | G05D 1/0061 |

FOREIGN PATENT DOCUMENTS

CN 110169049 A * 8/2019 ........... H04N 25/709

* cited by examiner

*Primary Examiner* — Mark D Featherstone
*Assistant Examiner* — Victor Perry
(74) *Attorney, Agent, or Firm* — Yao Legal Services, Inc.; Shun Yao

(57) ABSTRACT

The disclosure provides a method for performing self-test on a memory. The method can include determining an operation mode of a memory built-in self-test (MBIST) unit based on status of the memory; in response to the operation mode being a startup mode, configuring the MBIST unit to perform a memory self-test of a first type; and in response to the operation mode being a runtime mode, configuring the MBIST unit to periodically perform a memory self-test of a second type.

18 Claims, 6 Drawing Sheets

MEMORY-TEST APPARATUS 500

MODE-CONFIGURATION
LOGIC UNIT
502

TEST-PATTERN-
GENERATION LOGIC UNIT
504

ADDRESS-CONTROLLER
LOGIC UNIT
506

DATA-GENERATION LOGIC
UNIT
508

TEST-TRIGGERING LOGIC
UNIT
510

READ/WRITE LOGIC UNIT
512

COMPARATOR LOGIC UNIT
514

ERROR-REPORTING LOGIC
UNIT
516

SYSTEM AND METHOD FOR PERIODIC MARCH TEST IN VOLATILE MEMORIES

BACKGROUND

Field

This disclosure generally relates to memory self-tests. More specifically, the disclosed system and method relate to performing periodic march tests on memories during runtime.

Related Art

The reliability and performance of a computer system highly depend on the integrity of its memory devices. Like any other hardware component, a memory device can be susceptible to degradation, faults, or failures over time. To ensure the continued functionality and stability of the computer system, memory self-tests have become an essential tool in diagnosing potential issues and preemptively identifying memory-related problems. A memory self-test is a diagnostic procedure that enables the computer system to evaluate the integrity of its memory automatically. By implementing a series of self-checking algorithms and tests, these evaluations aim to detect errors, malfunctions, or weaknesses within the memory before they escalate into critical system failures.

Modern memory devices typically include built-in self-test (BIST) circuitries or units that can implement sophisticated test algorithms to execute a series of read and write operations on memory cells. Among the different memory test algorithms, March algorithms (or March tests) can provide an efficient tool to identify various types of faults, including stuck-at faults (where a memory cell is stuck at a certain logic level), transition faults (problems with switching between logic levels), and coupling faults (which can be caused by interference between adjacent cells). Note that the name "March" is derived from the initials of the basic memory operations involved in the algorithm: Move, And, Read, Write, Check, and Hold. March tests involve extensive read and write operations across the entire memory, potentially disrupting normal data access patterns and task execution, which may lead to unpredictable behavior, data corruption, or even system crashes if not carefully managed. Therefore, the March tests are often executed at the system power-up or power-down stage.

SUMMARY

The disclosure provides a method for performing self-tests on a memory. The method can include determining an operation mode of a memory built-in self-test (MBIST) unit based on a status of the memory; in response to the operation mode being a startup mode, configuring the MBIST unit to perform a memory self-test of a first type; and in response to the operation mode being a runtime mode, configuring the MBIST unit to periodically perform a memory self-test of a second type.

In a variation on this embodiment, determining the operation mode of the MBIST unit can include determining that the operation mode of the MBIST unit is the startup mode in response to detecting that the memory is starting up and determining that the operation mode of the MBIST unit is the runtime mode in response to detecting that the memory is running.

In a variation on this embodiment, the memory self-test of the first type has a longer test pattern than the memory self-test of the second type.

In a variation on this embodiment, the memory self-test of the first or second type can include a March test.

In a further variation, the memory self-test of the first type can include a March A or March B test.

In a further variation, the memory self-test of the second type comprises a March X or March Y test.

In a variation on this embodiment, periodically performing the memory self-test of the second type can include detecting that a processor associated with the memory enters a periodic interval, during which the processor is not accessing the memory and performing the memory self-test of the second type during the periodic interval.

In a further variation, the processor is an Image Signal Processor (ISP), and the periodic interval can include a vertical blanking interval or a horizontal blanking interval.

In a further variation, detecting that the processor enters the periodic interval can include receiving a signal from the processor.

In a further variation, the memory belongs to an automated driving system, and the method can further include, in response to detecting a memory error, generating and sending a notification to an upper-level safety-control unit in the automated driving system, thereby facilitating the upper-level safety-control unit to take corresponding safety-control measures to ensure vehicle safety.

The disclosure also provides a memory built-in self-test (MBIST) system for performing a self-test on a memory. The MBIST system can include a mode-configuration logic unit to configure an operation mode of the MBIST unit based on a status of a to-be-tested memory, a test-pattern-generation logic unit to generate a test pattern based on the operation mode, and a read/write logic unit to perform memory read and write operations based on the test pattern. The test-pattern-generation logic unit is to generate a test pattern of a first type in response to the operation mode being a startup mode, and the test-pattern-generation logic unit is to periodically generate a test pattern of a second type in response to the operation mode being a runtime mode.

In a variation on this embodiment, the mode-configuration logic unit is to configure the operation mode as the startup mode in response to detecting that the memory is starting up and configure the operation mode as the runtime mode in response to detecting that the memory is running.

In a variation on this embodiment, the test pattern of the first type is longer than the test pattern of the second type.

In a variation on this embodiment, the test pattern of the first or second type can include a March test pattern.

In a further variation, the test pattern of the first type can include a March A or March B test pattern, and the test pattern of the second type can include a March X or March Y test.

In a variation on this embodiment, the MBIST system can further include a test-triggering logic unit to trigger the memory self-test using the test pattern of the second type in response to detecting that a processor associated with the memory enters a periodic interval, during which the processor is not accessing the memory.

In a further variation, the processor is an Image Signal Processor (ISP), and the periodic interval can include a vertical blanking interval or a horizontal blanking interval.

In a further variation, the test-triggering logic is to detect that the processor enters the periodic interval based on a signal received from the processor.

In a further variation, the MBIST system, the memory, and the processor can be integrated into the same semiconductor chip.

In a variation on this embodiment, the memory belongs to an automated driving system, and the MBIST system can further include an error-reporting logic unit to generate and send a notification to an upper-level safety-control unit in the automated driving system in response to the self-test detecting a memory error, thereby facilitate the upper-level safety-control unit to take corresponding safety-control measures to ensure vehicle safety.

DESCRIPTION OF THE FIGURES

In the figures, like reference numerals refer to the same figure elements.

DETAILED DESCRIPTION

Figure 1:
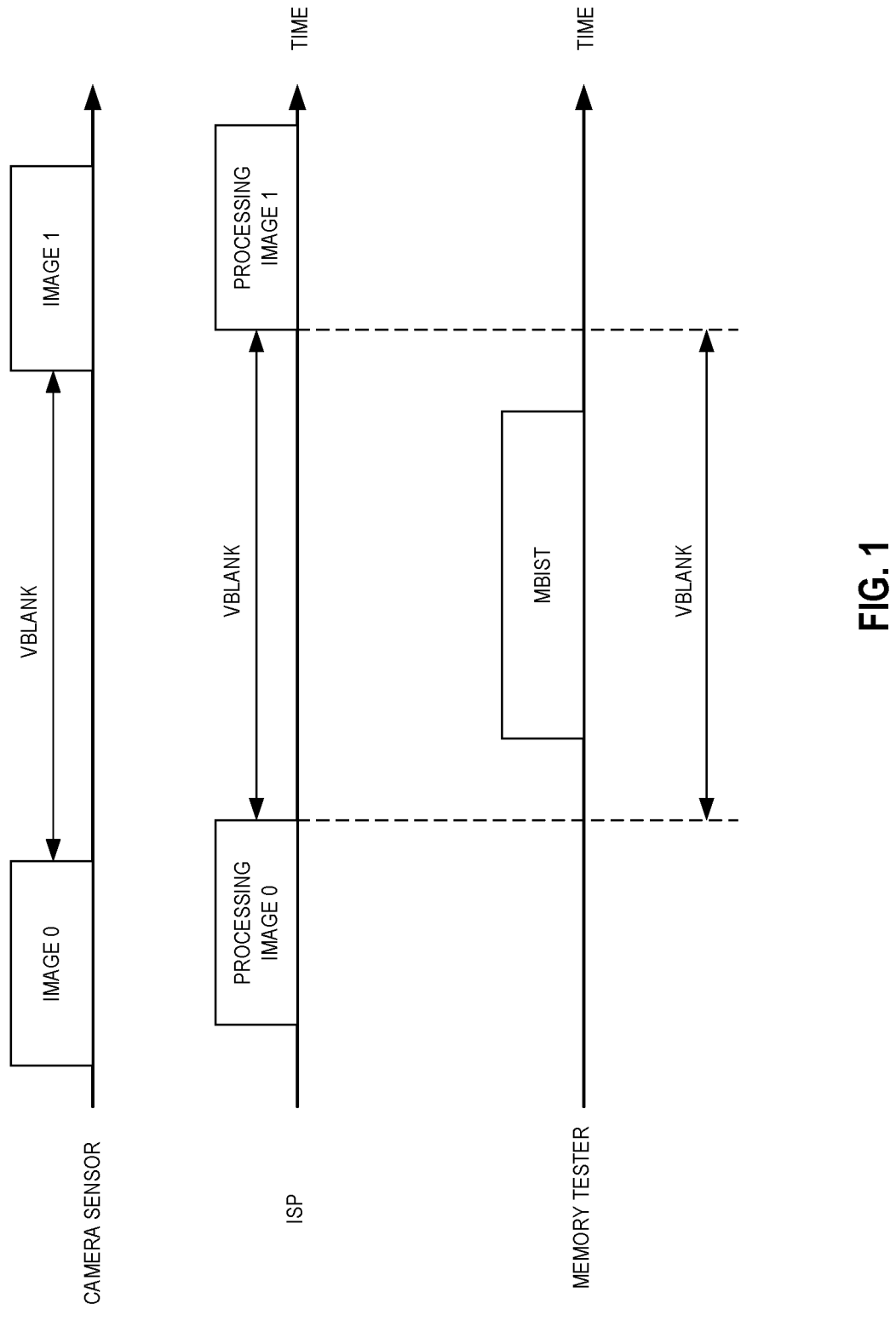
FIG. 1 illustrates exemplary timing diagrams associated with the memory built-in self-test (MBIST), according to one embodiment of the instant application.

The following description is presented to enable any person skilled in the art to make and use the disclosed embodiments and is provided in the context of one or more particular applications and their requirements. Various modifications to the disclosed embodiments will be readily apparent to those skilled in the art, and the general principles defined herein may be applied to other embodiments and applications without departing from the scope of those that are disclosed. Thus, the present invention or inventions are not intended to be limited to the embodiments shown, but rather are to be accorded the widest scope consistent with the disclosure.

Overview

The disclosure describes a system and method for performing memory self-tests at the startup stage and during the runtime of a memory system. The proposed built-in self-test (BIST) system can be configured to perform March tests periodically during the runtime of the memory. To test the memory used by a processor executing frame-based applications, periodic March tests can be performed during the intervals between consecutive frames. For example, to test memory used for image signal processing (ISP) applications, the March tests can be performed during the vertical blanking interval (VBI) or VBLANK. In one embodiment, the periodic March tests can implement an algorithm with fewer March elements (e.g., March X). In addition to the periodic tests, the BIST system can also perform a March test while the memory system is starting up. In one embodiment, the startup March test can implement an algorithm with more March elements (e.g., March B). Both the periodic and startup March tests can meet the memory testing requirement set by the autonomous driving safety standard.

Memory Test for Autonomous Driving

Like other computing systems, autonomous driving systems can be at risk of system failure resulting from faults in memories. Timely detection of memory faults can be critical in ensuring the safety of automatic driving vehicles. Vehicle safety standard ISO26262 specifies a number of memory testing mechanisms that can provide high diagnostic coverage for volatile memories (e.g., random-access memory). More particularly, memory monitoring using error-correction codes (ECC) or error-detection codes (EDC), the block replication mechanism, running the checksum such as cyclic redundancy check (CRC), and performing March tests are expected to achieve high diagnostic coverage.

ECC and EDC schemes can be used to detect and rectify n-bit data corruptions, including each single-bit failure, each two-bit failure, some three-bit failures, and some all-bit failures. Although the ECC/EDC schemes can provide the advantage of detecting errors without requiring dedicated test cycles, they rely on additional redundant ECC bits, which can increase the size of the memory. For example, the 128-bit memory requires an additional 9-bit ECC, which can contribute to the area overhead from the perspective of the design of the application-specific integrated circuit (ASIC).

The diagnosis coverage of block replication may be reduced by certain common failure modes. Moreover, running the checksum requires special considerations to make sure that the values used to determine the checksum are not changed during the checksum calculation.

Many memory protection systems utilize the Single Error Correction Double Error Detection (SECDED) technology, which requires running a fault injection test during the startup process. March tests can be a good option for detecting persistent bit failures (e.g., stuck-at faults or SAFs), bit transition failures (e.g., transition faults or TFs), addressing failures (e.g., address-decoder faults or AFs), linked cell failures (e.g., coupling faults or CFs), etc.

A March test can include a finite sequence of March elements, with each March element including a finite sequence of operations applied to each cell in the memory before proceeding to the next cell, according to a specified address order. Exemplary operations can include writing a "0" into a cell (denoted "W0"), writing a "1" into a cell (denoted "W1"), reading an expected "0" from a cell (denoted "R0"), and reading an expected "1" from a cell (denoted "R1"). Exemplary address orders can include ascending (denoted $\Uparrow$), descending (denoted $\Downarrow$), and irrelevant (denoted $\Updownarrow$). Note that all operations of a March element should be done before the test proceeds to the next address.

Depending on the specific algorithm, a test pattern can include fewer or more operations. For example, the test pattern of the MATS algorithm can include four operations: $\Updownarrow$ (W0); $\Updownarrow$ (R0, W1); $\Updownarrow$ (R1); and the test pattern of the MATS+ algorithm can include five operations: $\Updownarrow$ (W0); $\Uparrow$ (R0, W1); $\Downarrow$ (R1, W0).

A built-in self-test (BIST) system (or tester) can include circuits that are embedded in the memory system to reduce the test complexity and cost. A conventional BIST system typically performs memory tests when the system is powering up and may not be able to perform the tests during runtime. However, memory calls may fail during runtime, and undetected faults in memory may sometimes lead to system failure. For autonomous driving, performing runtime memory tests can be crucial to ensure data integrity in safety-critical systems.

In some embodiments of the instant application, the BIST system can take advantage of the blanking intervals (i.e., VBLANKs) existing during the processing of images. Note that VBLANK is a term originally associated with the raster scanning process in cathode-ray tube (CRT) displays. VBLANK refers to the period during which the electron beam in a CRT display returns from the bottom of the screen to the top, preparing for the next frame. This interval occurs during the vertical retrace of the electron beam. Image sensors can have similar blanking internals, both vertically and horizontally, to facilitate the reset of sensor elements and to provide additional time for processing. During VBLANK, the image signal processor (ISP) does not read from or write into the memory, thus making it possible to run the memory self-test.

FIG. 1 illustrates exemplary timing diagrams associated with the memory built-in self-test (MBIST), according to one embodiment of the instant application. The top portion of FIG. 1 shows an interval (i.e., VBLANK) between image frames generated by a camera sensor (e.g., a charge-coupled device (CCD) sensor). For example, after capturing image 0, the sensor elements of the camera sensor need to reset before the sensor can capture the next image, i.e., image 1. The interval needed for resetting the sensor elements between consecutive image frames is referred to as the vertical blanking interval or VBLANK. There is also a horizontal blanking interval (HBLANK), which refers to the time needed for resetting each row of the sensor elements. During VBLANK and HBLANK, the image sensor does not output data.

The image data (i.e., output of the image sensor) can be sent to the ISP for processing, frame by frame. The ISP processes the images in the order they come in. As shown by the center portion of FIG. 1, the same VBLANK exists between the processing of the two consecutive images. During VBLANK, the ISP does not receive any data from the camera sensor and, consequently, does not read from or write to the memory. Accordingly, the memory tester can perform MBIST, without any interruption to the normal memory operation, as shown by the bottom portion of FIG. 1.

The duration of VBLANK can be a few milliseconds. Depending on the type of camera sensor, VBLANK can last between one and five milliseconds. The memory tester can be designed to run MBIST over the entire memory during VBLANK. In some embodiments, the memory tester can run MBIST for different memory partitions in parallel.

In some embodiments, a memory tester can be configured to operate in two modes such as the startup mode and the runtime mode. More specifically, the memory tester can be configured to run different test algorithms while operating in different modes. Because the amount of time allocated for memory testing during system startup can be larger than during VBLANK, when operating in the startup mode, the memory tester can apply a more sophisticated testing algorithm. A number of March algorithms have been developed to detect specific types of faults (e.g., AFs, SAFs, TFs, and CFs) in memories. In some embodiments, while operating in the startup mode, the memory tester can perform the March B test, and while operating in the runtime mode, the memory tester can perform the March X test.

Figure 2:
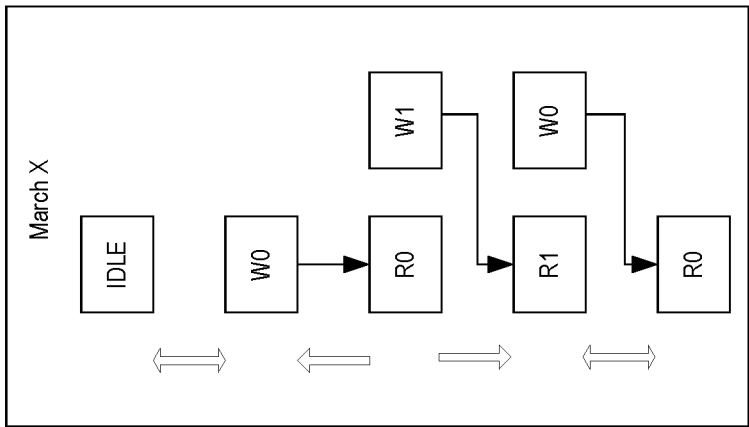
FIG. 2 illustrates the algorithms of the March B and March X tests, according to one embodiment of the instant application.
Figure 2:
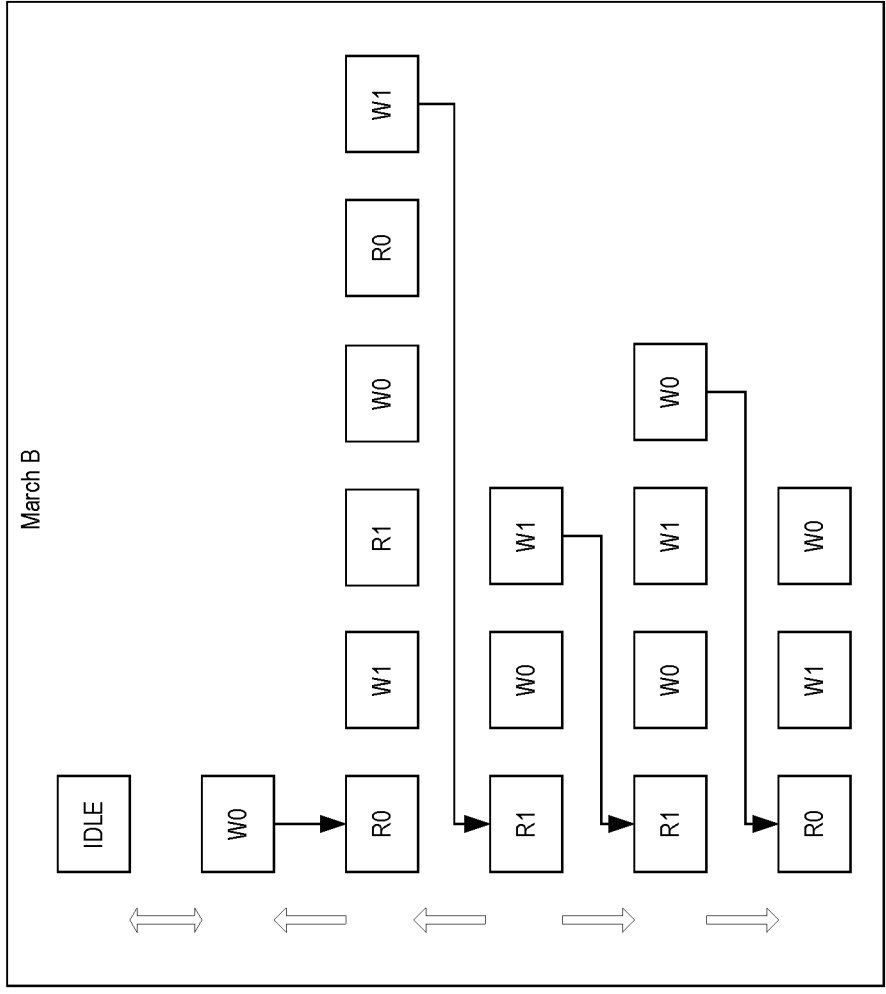

FIG. 2 illustrates the algorithms of the March B and March X tests, according to one embodiment of the instant application. As shown in FIG. 2, the test pattern of the March B algorithm can include 17 read and write operations, meaning that the test time is on the order of 17N, with N being the number of address locations. On the other hand, the test pattern of the March X algorithm can include six read and write operations, and the test time is on the order of 6N. Although the diagnostic coverage of March X is less than that of March B, it can still meet the requirement of the vehicle safety standard (e.g., ISO26262), thus making it a good candidate for runtime memory testing. In addition to March X, other memory testing algorithms can also be used during runtime, as long as the MBIST can provide sufficient diagnostic coverage (e.g., above 99%) and meet the time constraint (e.g., with a test time less than the duration of VBLANK). In one example, the March Y test may be used during runtime. Similarly, in addition to March B, other memory testing algorithms for the startup mode can also be possible. In one example, the March A test may be used at the startup stage.

Memory with BIST

Figure 3:
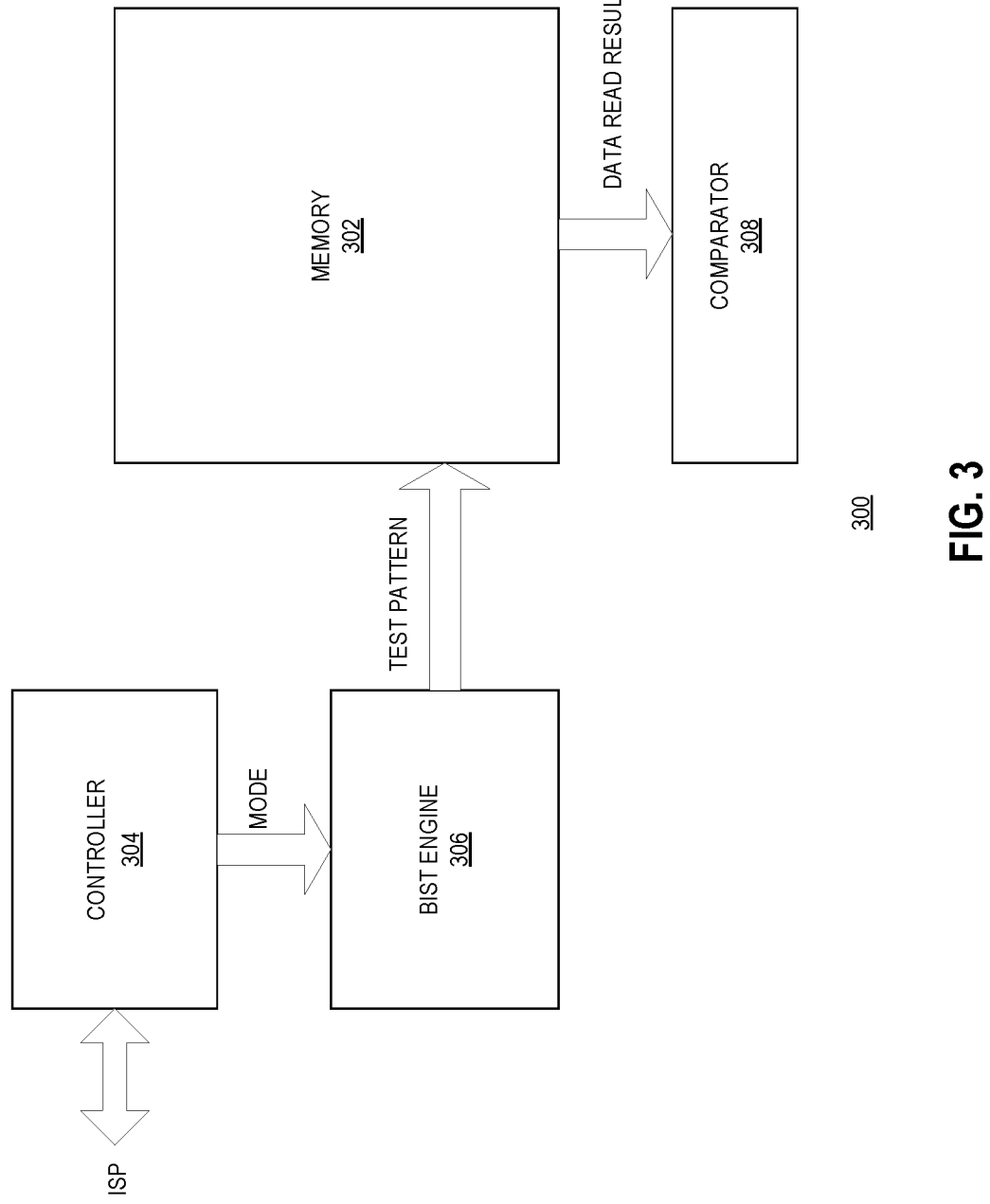
FIG. 3 illustrates exemplary architecture of a memory system with built-in self-test (BIST), according to one embodiment of the instant application.

FIG. 3 illustrates an exemplary architecture of a memory system with built-in self-test (BIST), according to one embodiment of the instant application. In FIG. 3, a memory system 300 can include a memory 302, a controller 304, a BIST engine 306, and a comparator 308.

Memory 302 can be a volatile memory, such as a Static Random Access Memory (SRAM) or a Dynamic Random Access Memory (DRAM). In some embodiments, memory 302 can be an SRAM that is part of the built-in memory of an ISP (e.g., as a cache). In one example, memory 302 can be integrated into the same semiconductor chip as the processor. In another example, memory 302 can be an off-chip memory.

Controller 304 can interface with the ISP to determine the testing mode (i.e., startup or runtime) based on the status of the ISP. More specifically, controller 304 can configure the operating mode of BIST engine 306. If the ISP is starting up, controller 304 can configure BIST engine 306 to operate in the startup mode. If the ISP is running, controller 304 can configure BIST engine 306 to operate in the runtime mode. Moreover, when the ISP is running, controller 304 can receive from the ISP, a signal indicating the arrival of each VBLANK. In response, controller 304 can send a trigger signal to BIST engine 306 to trigger the memory test.

In addition to performing the MBIST during the VBLANK of the ISP, controller 304 can also configure BIST engine 306 to run a memory test during each HBLANK. Controller 304 can receive, from the ISP, a signal indicating the starting of the HBLANK and then send a trigger signal to BIST engine 306 to trigger the memory test.

This runtime MBIST scheme can also be used for self-testing on memories associated with processors other than the ISP, especially processors that operate on frame-based data. For example, processors developed for machine applications are often used in neural network calculations for applying a large set of multiplications on weights, which can be read from the memory frame by frame. Between the reading/updating of each set of weights, the machine learning processor may not need to access the memory, thus creating an idle period that allows runtime MBIST. Depending on the application, the interval between consecutive idle periods may be different. Controller 304 can be responsible for configuring BIST engine 306 by setting the frequency of the MBIST.

BIST engine 306 can include a number of subunits (not shown in FIG. 3) that play various roles in the memory test. For example, BIST engine 306 can include a pattern generator that can generate test patterns based on the predetermined testing algorithm. Note that the testing algorithm depends on the operating mode of BIST engine 306. In some embodiments, when BIST engine 306 is operating in the startup mode, the pattern generator can generate test patterns based on the March B algorithm; when BIST engine 306 is operating in the startup mode, the pattern generator can generate test patterns based on the March X algorithm.

BIST engine 306 can include a read/write controller, which provides the location on the memory where data will be written during the write operation or from where data will be read during the read operation. BIST engine 306 can also include a data generator that provides the correct data to the memory corresponding to the particular element of the particular test pattern (e.g., March B or March X).

There can be different ways to implement BIST engine 306, including but not limited to microcode, hardware logic, and processor-based. For example, the test algorithm (e.g., March B or March X) can be realized using hardware-based finite-state machines. The processor-based BIST can rely on the processor to execute instructions to generate test patterns. The microcode-based BIST relies on a microcontroller executing the microcode of the testing algorithms. The scope of this disclosure is not limited by the particular implementation scheme of BIST engine 306.

Comparator 308 can be used to compare the data actually read from memory 302 with the expected data according to the test pattern. For example, an R1 operation is expected to return a value of "1," and an R0 operation is expected to return a value of "0." An error is detected if the read value differs from the expected value. Comparator 308 can generate a memory-error report in response to detecting errors through the BIST process. In some embodiments, the memory-error report can be sent to an upper-layer safety-control system of an advanced driver-assistance system (ADAS) or an automated driving system (ADS). The upper-layer safety-control system can determine, based on the memory error report and the status of the vehicle, whether further actions are needed. For example, if errors detected in the memory may cause widespread system failure, the upper-layer safety-control system can display a warning signal to the user. The user may stop operating the vehicle to prevent accidents.

Figure 4:
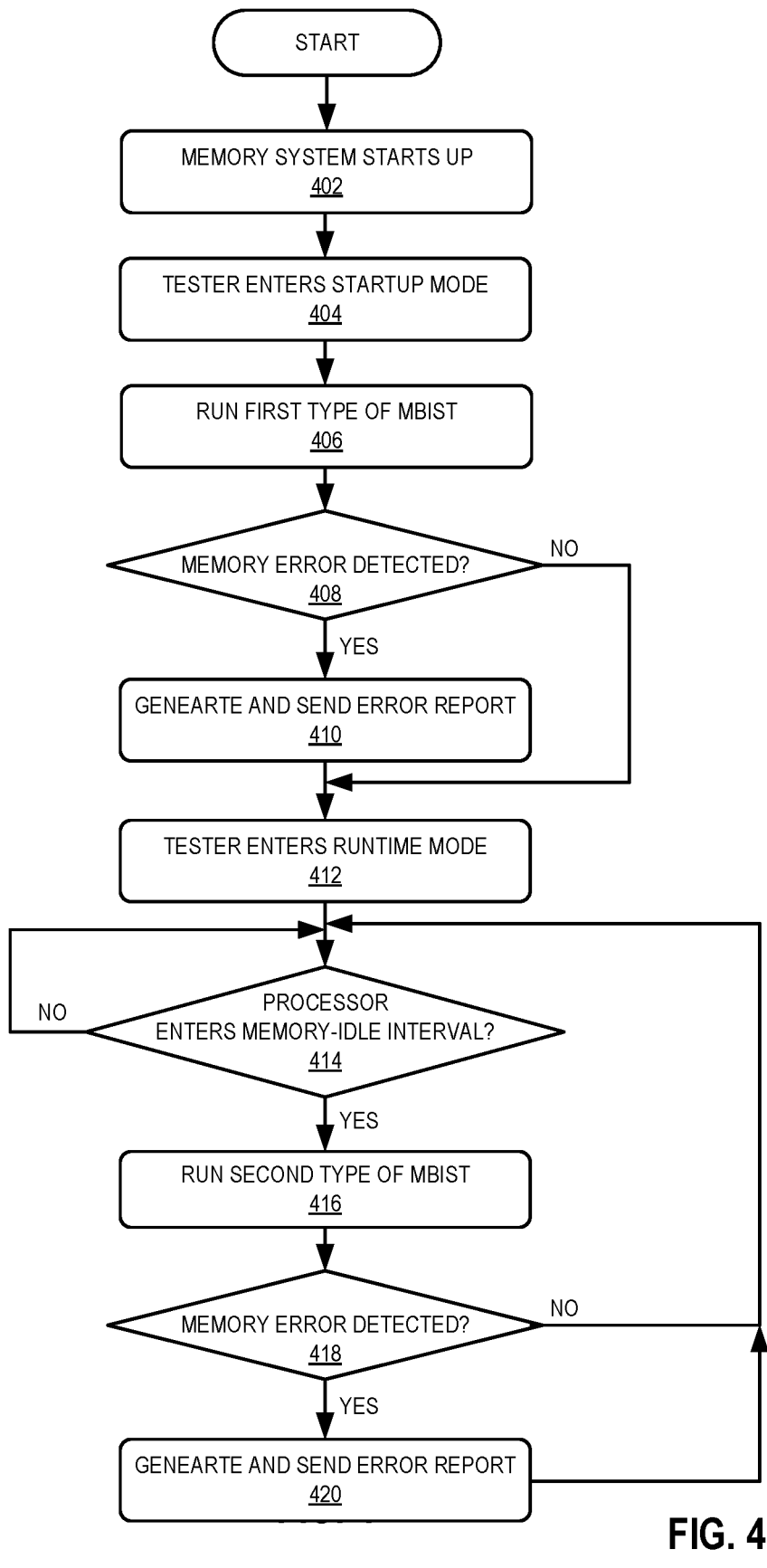
FIG. 4 presents a flowchart illustrating an exemplary process for performing memory self-test, according to one embodiment of the instant application.

FIG. 4 presents a flowchart illustrating an exemplary process for performing memory self-tests, according to one embodiment of the instant application. In one or more embodiments, one or more of the steps in FIG. 4 may be repeated and/or performed in a different order. Accordingly, the specific arrangement of steps shown in FIG. 4 should not be construed as limiting the scope of the technique.

During operation, the memory system starts up (operation 402). In most cases, the memory system starts up when the entire computer system is being powered up. The tester can enter the startup mode (operation 404) and run a first type of MBIST (operation 406). Note that running the first type of MBIST can be part of the system startup sequence. In some embodiments, the first type of MBIST can include a March A or March B test. While in the startup mode, the tester can be configured to generate test patterns based on the first type of MBIST (e.g., March A or March B). The tester can determine whether memory errors are detected (operation 408). If so, the tester can generate and send an error report to the upper-level safety-control system (410). The upper-level safety-control system can then take appropriate actions based on the type and location of the reported memory errors. If no memory error is detected, the process continues.

Subsequent to performing the first type of MBIST, the tester can enter the runtime mode (operation 412) and determine whether the processor enters a memory-idle interval (operation 414). The memory-idle interval refers to a periodic interval when the processor does not access the memory. In some embodiments, the processor can be an ISP, and the memory-idle interval can be an VBLANK or HBLANK interval. In one example, the tester can receive a signal from the ISP, indicating that it is entering a VBLANK or HBLANK interval.

If the processor enters the memory-idle interval, the tester can run a second type of MBIST (operation 416). Otherwise, it waits for the processor to enter the memory-idle interval (operation 414). In some embodiments, the second type of MBIST can include a March X or March Y test. While in the runtime mode, the tester can be configured to generate test patterns based on the second type of MBIST algorithm (e.g., March X or March Y). Due to the time constraint in testing during runtime, the second type of MBIST generally has a shorter pattern than the first type of MBIST. Similarly, the tester can determine whether memory errors are detected by the second type of MBIST (operation 418). If so, the tester can generate and send an error report to the upper-level safety-control system (420). Otherwise, the tester can wait for the next memory-idle interval (operation 414).

Figure 5:
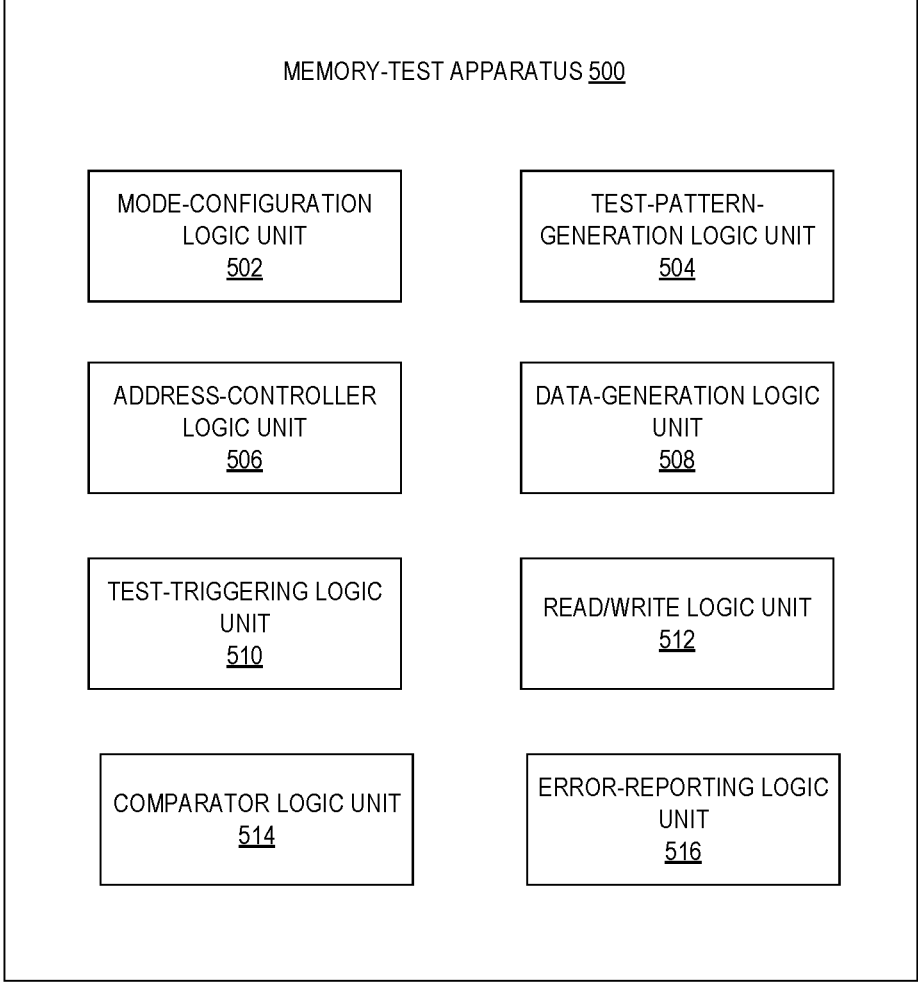
FIG. 5 illustrates the block diagram of an exemplary apparatus for memory self-test, according to one embodiment of the instant application.

FIG. 5 illustrates the block diagram of an exemplary apparatus for memory self-test, according to one embodiment of the instant application. In FIG. 5, a memory-test apparatus 500 can include a mode-configuration logic unit 502, a test-pattern-generation logic unit 504, an address-controller logic unit 506, a data-generation logic unit 508, a test-triggering logic unit 510, a read/write logic unit 512, a comparator logic unit 514, and an error-reporting logic unit 516. In some embodiments, memory-test apparatus 500 can reside on the same semiconductor chip as the processor and the on-chip memory. The various logic units in memory-test apparatus 500 can be implemented using hardware, software, firmware, or a combination thereof.

Mode-configuration logic unit 502 can be responsible for determining and configuring the operation mode of memory-teste apparatus 500 based on the status of the entire memory system. If the memory system is powering up, mode-configuration logic unit 502 can configure the operation mode of memory-teste apparatus 500 as the startup mode. On the other hand, if the memory system is up and running, mode-configuration logic unit 502 can configure the operation mode of memory-teste apparatus 500 as the runtime mode.

Test-pattern-generation logic unit 504 can be responsible for generating memory-test patterns based on the operation mode. In some embodiments, if the operation mode is the startup mode, test-pattern-generation logic unit 504 can generate a test pattern according to the March B algorithm (referred to as the March B test pattern). If the operation mode is the runtime mode, test-pattern-generation logic unit 504 can periodically generate a test pattern according to the March X algorithm (referred to as the March X test pattern). Exemplary March B and March X test patterns are shown in FIG. 2. Each test pattern determines a particular memory operation sequence that specifies the read/write pattern and the address order. In addition to March B and March X, other testing algorithms can also be used.

Address-controller logic unit 506 can be responsible for determining the start and stop addresses of each memory test and for incrementing/decrementing the read/write address based on the test pattern. Note that the memory can be divided into smaller regions to allow multiple tests to be carried out in parallel. Address-controller logic unit 506 can determine the start and stop addresses of each test.

Data-generation logic unit 508 can be responsible for generating the data to be written to the memory. Test-triggering logic unit 510 can be responsible for triggering the memory test during runtime. More specifically, test-triggering logic unit 510 can receive a trigger signal from the processor, indicating that the processor is entering a memory-idle interval. In response, test-triggering logic unit 510 can trigger the memory test (i.e., to start the write/read operations according to the test pattern generated by test-pattern-generation logic unit 504). Read/write logic unit 512 can be responsible for reading from and writing to the memory according to the test pattern. More specifically, read/write logic unit 512 can interact with address-controller logic unit 506 and data-generation logic unit 508 to read/write the correct data. Read/write logic unit 512 may also determine the number of cycles a given address is maintained before the address is incremented or decremented.

Comparator logic unit 514 can be responsible for comparing data read from the memory by read/write logic unit 512 to their expected values in order to detect memory errors. For example, if an "R1" operation returns a "0," a memory error has been detected. The memory error may indicate an AF, an SAF, a TF, or a CF, depending on where in the test sequence the error is detected. Error-reporting logic unit 516 can be responsible for generating an error report based on the memory test result. Error-reporting logic unit 516 can also be responsible for sending the error report to an upper-level safety controller to facilitate the upper-level safety controller to take appropriate measures to ensure vehicle safety.

Figure 6:
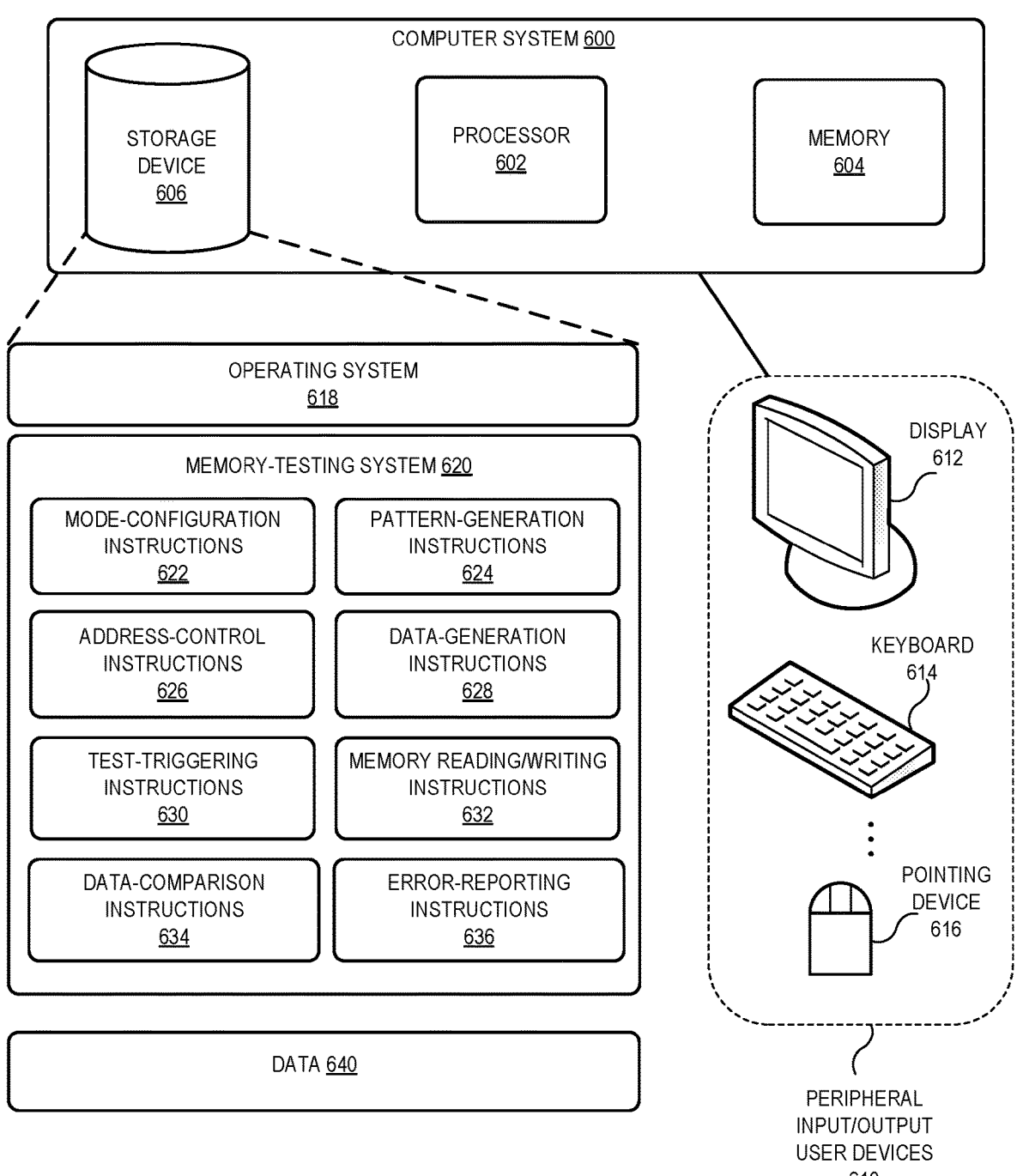
FIG. 6 illustrates an exemplary computer system for implementing memory self-test, according to one embodiment of the instant application.

FIG. 6 illustrates an exemplary computer system for implementing memory self-test, according to one embodiment of the instant application. Computer system 600 includes a processor 602, a memory 604, and a storage device 606. Furthermore, computer system 600 can be coupled to peripheral input/output (I/O) user devices 610, e.g., a display device 612, a keyboard 614, and a pointing device 616. Storage device 606 can store an operating system 618, a memory-testing system 620, and data 640. In some embodiments, computer system 600 can be implemented as part of an advanced driver-assistance system (ADAS) or an automated driving system (ADS) installed on a vehicle. Memory-testing system 620 can be used to detect errors in memory 604, which can be integrated onto the same chip with processor 602. In alternative embodiments, memory 604 can be off the chip.

Memory-testing system 620 can include instructions, which when executed by computer system 600, can cause computer system 600 or processor 602 to perform methods and/or processes described in this disclosure. Specifically, memory-testing system 620 can include instructions for configuring the operation mode of the memory self-test (mode-configuration instructions 622), instructions for generating the test patterns based on the operation mode (pattern-generation instructions 624), instructions for determining the memory read/write addresses (address-control instructions 626), instructions for generating data to be written to the memory (data-generation instructions 628), instructions for triggering the memory self-test (test-triggering instructions 630), instructions for reading/writing the to-be-tested memory locations (memory reading/writing instructions 632), instructions for comparing data read from the to-be-tested memory with expected values (data-comparison instructions 634), and instructions for reporting memory errors to an upper-level safety controller (error-reporting instructions 636).

In general, this disclosure presents a solution to the problem of performing memory self-tests during runtime without adding area overhead to the memory under test. According to some embodiments, an MBIST system can be configured to perform memory self-tests both at the startup of the memory system and periodically during runtime. The MBIST system can be configured to operate in the startup mode when the memory system is starting up and in the runtime mode when the memory system is running normally. While in the startup mode, the MBIST system can run a self-test with a longer test pattern, such as the March A or March B test. While in the runtime mode, the MBIST system can run a self-test with a shorter test pattern, such as the March X or March Y test. More specifically, while the memory system is running, the MBIST system can take advantage of periodic memory-idle intervals during which the processor is not accessing the memory system by running the self-test during the memory-idle intervals. For a memory associated with an ISP, the MBIST system can run the self-test during the periodic VBLANK or HBLANK. In some embodiments, the MBIST system can be part of the memory system of an ADS or ADAS of a vehicle. If the MBIST system detects one or more memory errors, it can generate and send an error report to the upper-level safety control unit within the ADS or ADAS, which can then take appropriate actions to ensure vehicle safety.

Data structures and program code described in this detailed description are typically stored on a non-transitory computer-readable storage medium, which may be any device or medium that can store code and/or data for use by a computer system. Non-transitory computer-readable storage media include, but are not limited to, volatile memory; non-volatile memory; electrical, magnetic, and optical storage devices, solid-state drives, and/or other non-transitory computer-readable media now known or later developed.

Methods and processes described in the detailed description can be embodied as code and/or data, which may be stored in a non-transitory computer-readable storage medium as described above. When a processor or computer system reads and executes the code and manipulates the data stored on the medium, the processor or computer system performs the methods and processes embodied as code and data structures and stored within the medium.

Furthermore, the optimized parameters from the methods and processes may be programmed into hardware modules such as, but not limited to, application-specific integrated circuit (ASIC) chips, field-programmable gate arrays (FP-GAs), and other programmable-logic devices now known or hereafter developed. When such a hardware module is activated, it performs the methods and processes included within the module.

The foregoing embodiments have been presented for purposes of illustration and description only. They are not intended to be exhaustive or to limit this disclosure to the forms disclosed. Accordingly, many modifications and variations will be apparent to practitioners skilled in the art. The scope is defined by the appended claims, not the preceding disclosure.

What is claimed is:

1. A method for performing self-tests on a memory, the method comprising:
   determining an operation mode of a memory built-in self-test (MBIST) unit based on a status of the memory;
   in response to the operation mode being a startup mode, configuring the MBIST unit to perform a memory self-test of a first type; and in response to the operation mode being a runtime mode, configuring the MBIST unit to periodically perform a memory self-test of a second type, wherein periodically performing the memory test of the second type comprises:

detecting that a processor associated with the memory enters a periodic interval, during which the processor is not accessing the memory; and performing the memory self-test of the second type during the periodic interval.

2. The method of claim 1, wherein determining the operation mode of the MBIST unit comprises:

determining that the operation mode of the MBIST unit is the startup mode in response to detecting that the memory is starting up; and determining that the operation mode of the MBIST unit is the runtime mode in response to detecting that the memory is running.

3. The method of claim 1, wherein the memory self-test of the first type has a longer test pattern than the memory self-test of the second type.

4. The method of claim 1, wherein the memory self-test of the first or second type comprises a March test.

5. The method of claim 1, wherein the processor is an Image Signal Processor (ISP), and wherein the periodic interval comprises a vertical blanking interval or a horizontal blanking interval.

6. The method of claim 1, wherein detecting that the processor enters the periodic interval comprises receiving a signal from the processor.

7. The method of claim 1, wherein the memory belongs to an automated driving system, and wherein the method further comprises:

in response to detecting a memory error, generating and sending a notification to an upper-level safety-control unit in the automated driving system, thereby facilitating the upper-level safety-control unit to take corresponding safety-control measures to ensure vehicle safety.

8. The method of claim 4, wherein the memory self-test of the first type comprises a March A or March B test.

9. The method of claim 4, wherein the memory self-test of the second type comprises a March X or March Y test.

10. A memory built-in self-test (MBIST) system for performing a self-test on a memory, comprising:

a controller for interfacing with a processor associated with the memory; and a MBIST engine coupled to the controller;

wherein the controller is to configure an operation mode of the MBIST engine based on a status of the memory; and wherein the MBIST engine is configured to:

generate a test pattern of a first type in response to the operation mode being a startup mode;

periodically generate a test pattern of a second type in response to the operation mode being a runtime mode;

perform memory read and write operations based on the generated test pattern of the first or second type; and trigger the memory self-test using the test pattern of the second type in response to the controller detecting that the processor enters a periodic interval, during which the processor is not accessing the memory.

11. The MBIST system of claim 10, wherein the controller is to:

configure the operation mode as the startup mode in response to detecting that the memory is starting up; and configure the operation mode as the runtime mode in response to detecting that the memory is running.

12. The MBIST system of claim 10, wherein the test pattern of the first type is longer than the test pattern of the second type.

13. The MBIST system of claim 10, wherein the test pattern of the first or second type comprises a March test pattern.

14. The MBIST system of claim 10, wherein the processor is an Image Signal Processor (ISP), and wherein the periodic interval comprises a vertical blanking interval or a horizontal blanking interval.

15. The MBIST system of claim 10, wherein the controller is to detect that the processor enters the periodic interval based on a signal received from the processor.

16. The MBIST system of claim 10, wherein the MBIST system, the memory, and the processor are integrated into a same semiconductor chip.

17. The MBIST system of claim 10, wherein the memory belongs to an automated driving system, and wherein the MBIST system further comprises:

a comparator to compare data read from the memory with expected data according to the test pattern of the first or second type and to generate and send a notification to an upper-level safety-control unit in the automated driving system in response to the self-test detecting a memory error, thereby facilitating the upper-level safety-control unit to take corresponding safety-control measures to ensure vehicle safety.

18. The MBIST system of claim 13, wherein the test pattern of the first type comprises a March A or March B test pattern, and wherein the test pattern of the second type comprises a March X or March Y test.

* * * * *